United States Patent [19]

Hanada

[11] Patent Number: 5,158,902
[45] Date of Patent: Oct. 27, 1992

[54] METHOD OF MANUFACTURING LOGIC SEMICONDUCTOR DEVICE HAVING NON-VOLATILE MEMORY

[75] Inventor: Naoki Hanada, Yokohama, Japan

[73] Assignee: Kabushiki Kaisha Toshiba, Kawasaki, Japan

[21] Appl. No.: 647,699

[22] Filed: Jan. 29, 1991

Related U.S. Application Data

[62] Division of Ser. No. 514,402, Apr. 26, 1990, abandoned.

[30] Foreign Application Priority Data

Apr. 28, 1989 [JP] Japan .................. 1-110505

[51] Int. Cl.[5] .................. H01L 21/265; H01L 21/70
[52] U.S. Cl. .................. 437/43; 437/48; 437/45; 437/52
[58] Field of Search .................. 357/23.4, 41, 23.5, 357/23.6; 437/43, 45, 50, 52

[56] References Cited

U.S. PATENT DOCUMENTS

| 4,426,764 | 1/1984 | Kosa et al. ............. 437/43 |
| 4,471,373 | 9/1984 | Shimizu et al. ......... 357/23.5 |
| 4,598,460 | 7/1986 | Owens et al. ........... 437/52 |
| 4,635,347 | 1/1987 | Lien et al. ............. 437/43 |
| 4,651,406 | 3/1987 | Shimizu et al. ......... 148/187 |
| 4,663,645 | 5/1987 | Komori et al. ......... 357/23.5 |
| 4,720,323 | 1/1988 | Sato .................... 437/193 |
| 4,745,083 | 5/1988 | Huie ................... 437/45 |
| 4,768,080 | 8/1988 | Sato .................... 365/185 |
| 4,830,974 | 5/1989 | Chang et al. .......... 437/34 |
| 4,835,740 | 5/1989 | Sato .................... 357/23.5 |
| 4,851,361 | 7/1989 | Schumann et al. ...... 437/43 |
| 4,859,619 | 8/1989 | Wu et al. .............. 437/43 |
| 4,872,041 | 10/1989 | Sugiura ................ 357/23.5 |
| 4,890,148 | 12/1989 | Ikeda et al. .......... 357/45 |
| 4,895,544 | 7/1989 | Shimizu ............... 357/71 |

FOREIGN PATENT DOCUMENTS

| 0187278 | 7/1986 | European Pat. Off. . |
| 0301363 | 2/1989 | European Pat. Off. ..... 357/23.5 |
| 0007162 | 1/1982 | Japan .................. 437/43 |
| 61-42171 | 2/1986 | Japan . |
| 0082581 | 3/1990 | Japan .................. 357/23.5 |
| 2080024 | 1/1982 | United Kingdom ...... 357/23.5 |

Primary Examiner—Olik Chaudhuri
Assistant Examiner—Loc Q. Trinh
Attorney, Agent, or Firm—Finnegan, Henderson, Farabow, Garrett and Dunner

[57] ABSTRACT

The present invention discloses a logic semiconductor device having a non-volatile memory in which a memory cell portion and a logic circuit portion are formed on a single semiconductor substrate, and a floating gate of the memory cell portion and a gate of the logic circuit portion are made of different materials, and a method of manufacturing the same.

2 Claims, 4 Drawing Sheets

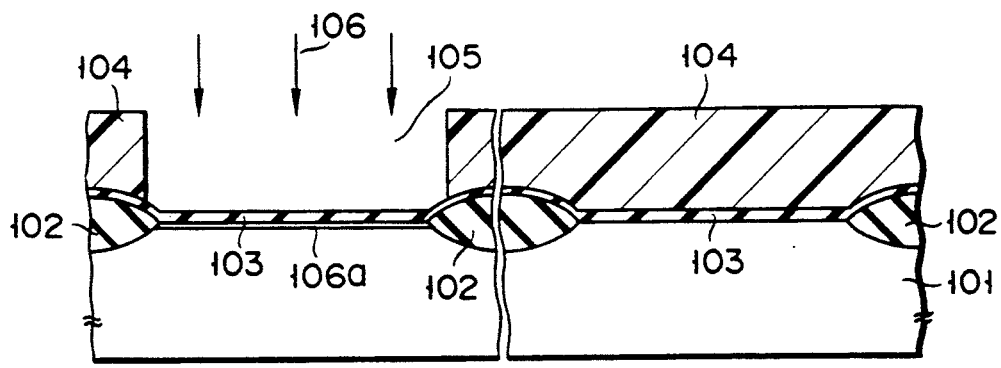
F I G. 1A
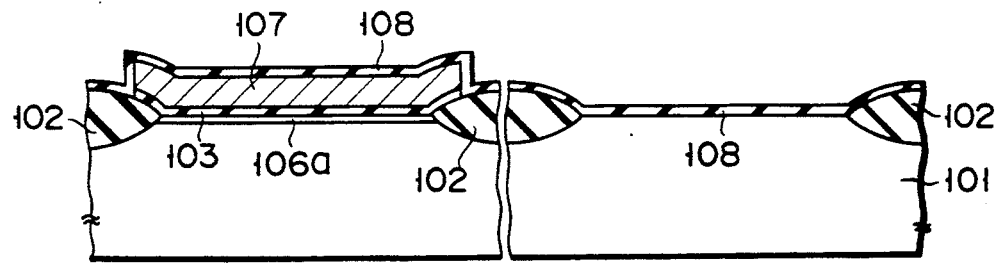
F I G. 1B
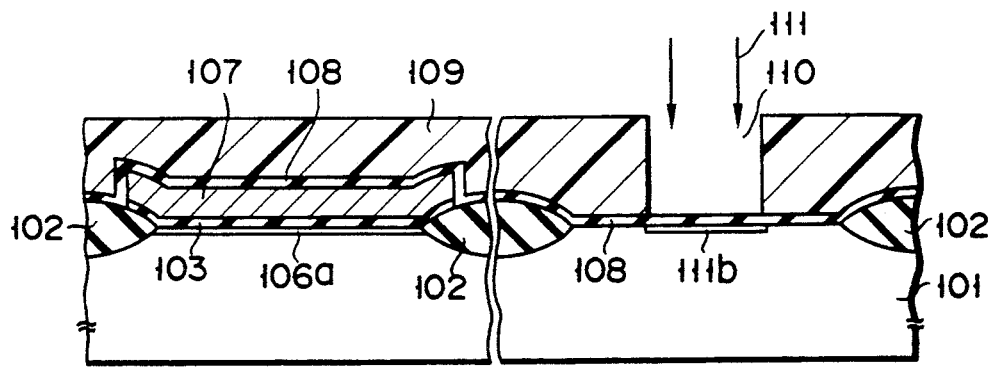
F I G. 1C
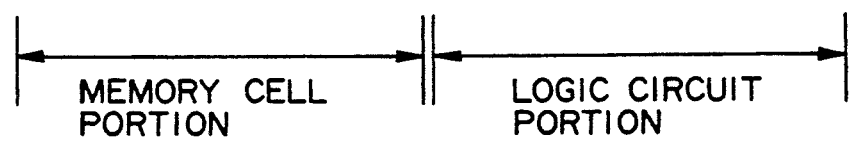

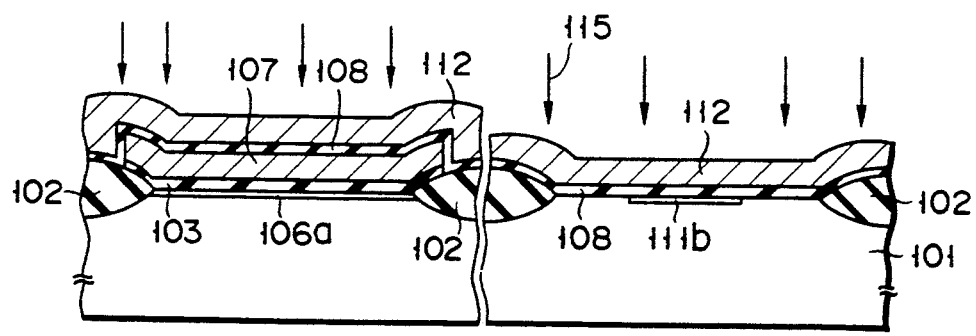
FIG. 1D
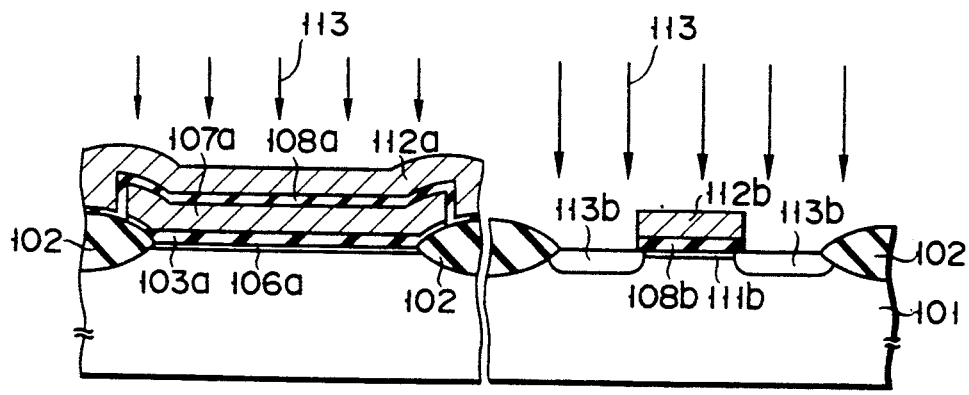
FIG. 1E
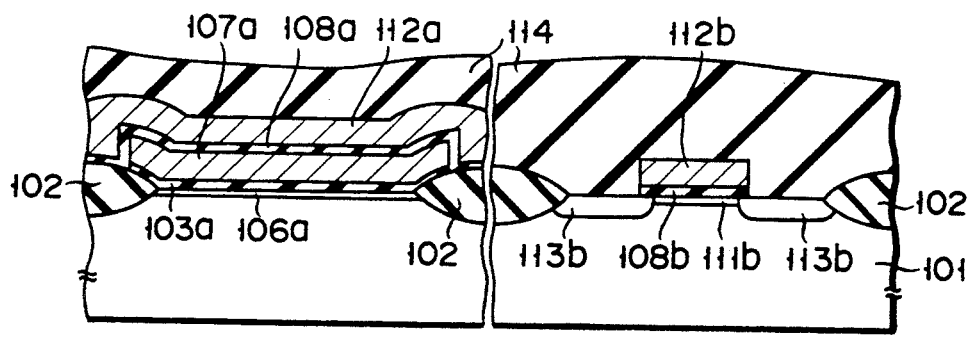
FIG. 1F
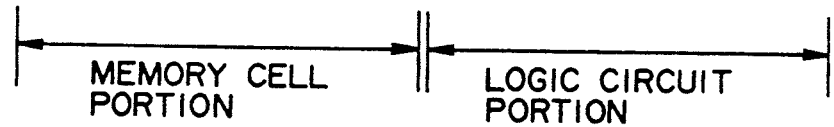

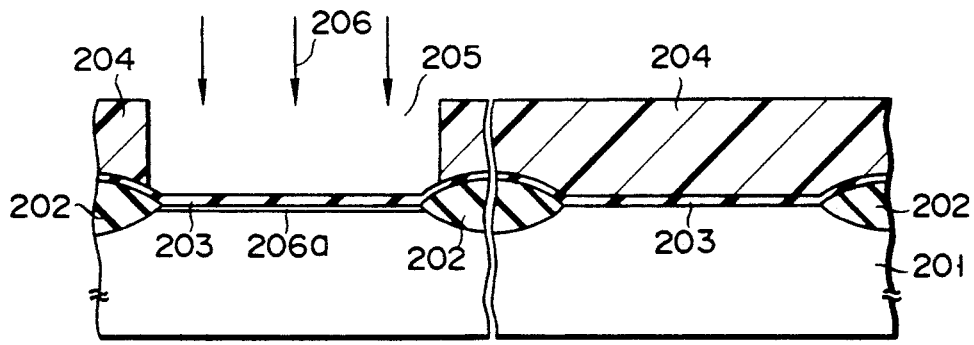
FIG. 2A
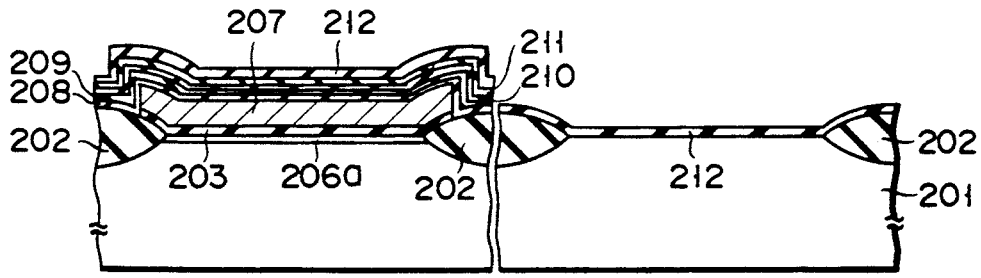
FIG. 2B
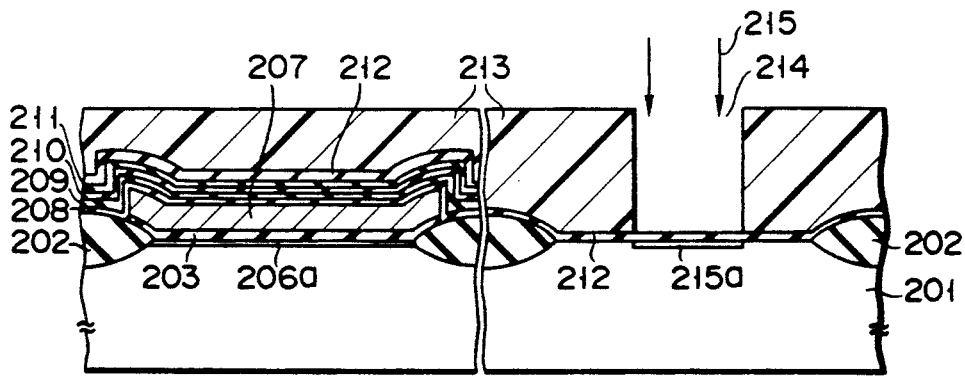
FIG. 2C
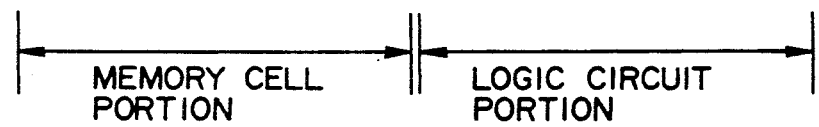

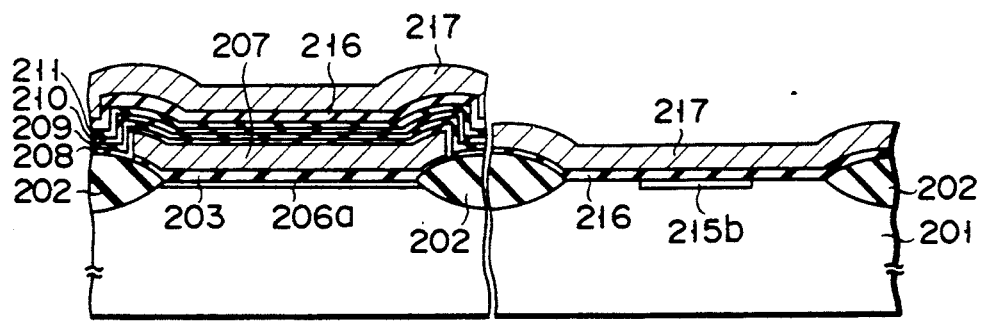
FIG. 2D
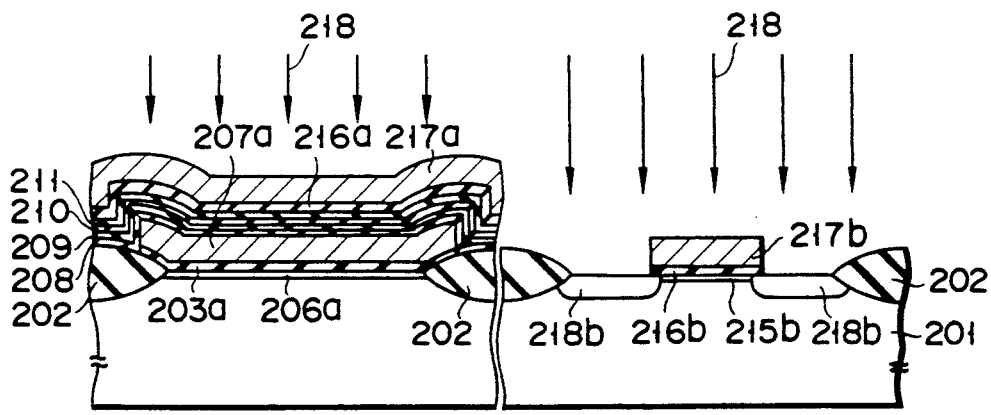
FIG. 2E
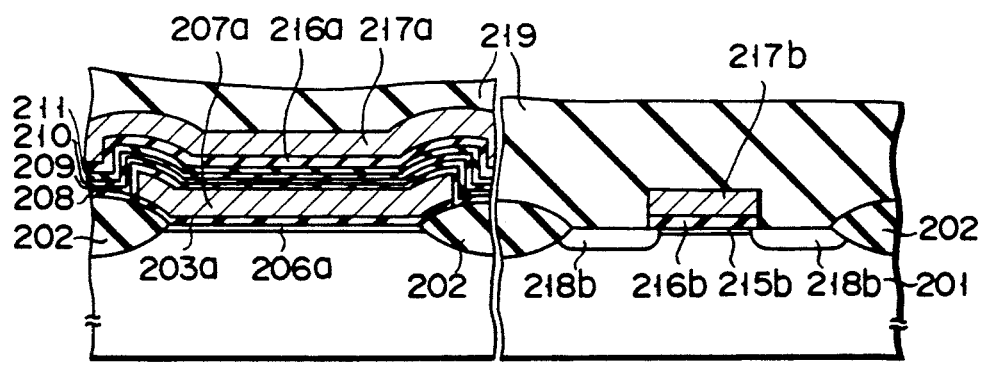
FIG. 2F
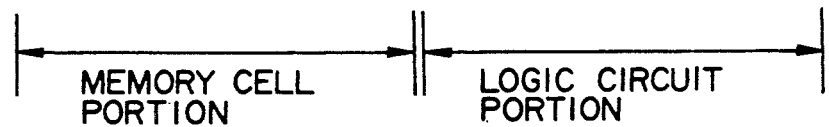

METHOD OF MANUFACTURING LOGIC SEMICONDUCTOR DEVICE HAVING NON-VOLATILE MEMORY

This application is a division, of application Ser. No. 07/514,402, filed Apr. 26, 1990 now abandoned.

BACKGROUND OF THE INVENTION

1. Field of the Invention

The present invention relates to a logic circuit portion, and the floating gate of a memory cell portion are formed in the same step and made of the same material.

2. Description of the Related Art

In a conventional logic semiconductor device having a non-volatile memory, the gate of a logic circuit portion, and the floating gate of a memory cell portion are formed in the same step and made of the same material.

For example, when the floating gate of the memory cell portion and the gate of the logic circuit portion are formed on a polysilicon layer formed in the same step as these gates, an impurity for controlling threshold values of the memory cell portion and the logic circuit portion must be doped in both the channel regions of the memory cell portion and the logic circuit portion before the polysilicon layer is formed during the manufacture.

In the above step, an annealing process for forming a second gate oxide film (inter poly) between the floating and control gates is performed in order to isolate the floating gate of the memory cell portion from the control gate after an impurity doping process and a polysilicon layer formation process. For this reason, the heat of the annealing process affects the impurity for controlling the threshold value doped in the channel region of the logic circuit portion. Thus, when the impurity for controlling the threshold value doped in the channel region of the logic circuit portion is affected by heat generated in the annealing process during formation of the second gate oxide film (inter poly) of the memory cell portion, a channel profile in the logic circuit portion is disturbed. The threshold value of the logic circuit portion is hard to control, and formation of a desired channel profile is difficult. That is, in a conventional logic semiconductor device having a non-volatile memory in which the gate of a logic circuit portion and the floating gate of the memory cell portion are made of the same material, a channel profile in the logic circuit portion is disturbed. The logic circuit portion is not suitable for micropatterning. In addition, in a conventional device, the floating gate of a memory cell portion, and the gate of the logic circuit portion are respectively made of polysilicon layers formed in the same step. For this reason, in a conventional logic semiconductor device having a non-volatile memory, in order to provide a thicknesses difference and characteristics difference between both the gate electrodes in the memory cell portion and the logic circuit portion, a photoresist film must be formed on either of the gate oxide films. Therefore, reliability of the device may be degraded, e.g., a gate breakdown voltage is decreased.

SUMMARY OF THE INVENTION

It is an object of the present invention to provide a highly reliable micropatterned logic semiconductor device having a non-volatile memory and a method of manufacturing the same, wherein the floating gate of a memory cell portion and the gate of a logic circuit portion have the different thickness and characteristics, and controllability of the threshold value of a MOSFET in the logic circuit portion can be improved, a desired channel profile is easily formed.

According to a logic semiconductor device having a non-volatile memory of the present invention, the floating gate of a memory cell portion and the gate of a logic circuit portion are formed by conductive layers made of different materials, respectively.

A first method of manufacturing the device comprises the steps of forming a well region on a surface of a semiconductor substrate forming a first insulating film serving as an element isolating region on the surface of semiconductor substrate, forming a second insulating film doping a threshold control impurity in a channel region of a memory cell portion, forming a first conductive layer of a first material serving as a floating gate of the memory cell portion, removing the second insulating film, a third insulating film serving as a first gate insulating film of a memory cell portion on the surface of an element region isolated by the first insulating film, patterning the first conductive layer to determine a size of the floating gate in a direction of channel width and to expose a logic circuit portion forming region, forming a second gate insulating film of the memory cell portion and a third insulating film serving as a gate insulating film of the logic circuit portion, doping a threshold value control impurity in a channel region of a logic circuit portion, forming a second conductive layer which is to serve as a control gate of the memory cell portion and a gate of the logic circuit portion and which is made of a second material different from the first material, and patterning the second conductive layer to determine sizes of the control gate and the floating gate in a direction of channel length, sizes of the gates in the directions of channel length and width, and wirings.

A second method of manufacturing a logic semiconductor device having a non-volatile memory comprises the steps of forming a well region on a surface of a semiconductor substrate, forming a first insulating film serving as an element isolating region on the surface of the semiconductor substrate, forming a second insulating film serving as a first gate insulating film of a memory cell portion on an element region surface isolated by the first insulating film, doping a threshold value control impurity in a channel region of the memory cell portion, forming a first conductive layer which is to serve as a floating gate of the memory cell portion and which is made of a first material, patterning the first conductive layer to determine a size of the floating gate in a direction of channel width and to expose a logic circuit portion forming region, forming a third insulating film on a surface of the patterned first conductive layer, forming a fourth insulating film having a low oxidization rate on the third insulating film, removing the third and fourth insulating films to expose the logic circuit portion forming region, forming a fifth insulating film serving as a sacrificial insulating film, doping a threshold value control impurity in a channel region of a logic circuit portion, removing the fifth insulating film, forming a sixth insulating film which is to serve as a gate insulating film of the logic circuit portion, forming a second conductive layer which is to serve as a control gate of the memory cell portion and a gate of the logic circuit portion and which is made of a second material different from the first material, and patterning the second conductive layer to determine sizes of the control gate and the floating gate in a direction of channel length, sizes of the gates in the directions of channel length and width, and wirings.

In the above logic semiconductor device having a non-volatile memory and the method of manufacturing the same, since the floating gate of the memory cell portion and the gate of the logic circuit portion are constituted by conductive layers which are made of different materials, respectively, characteristics of the conductive layers can be desirably controlled.

In the first method of manufacturing the device, the device can be formed without disturbance of the channel profile of the MOSFET in the logic circuit portion.

In the second method of manufacturing the device, since sacrificial oxidization can be performed for the logic circuit portion, the thickness of the second insulating film for electrically isolating the control gate of the memory cell portion from the floating gate and the thickness of the gate insulating film of the logic circuit portion can be independently controlled.

BRIEF DESCRIPTION OF THE DRAWINGS

FIGS. 1A to 1F are views showing the steps in manufacturing a logic semiconductor device having a non-volatile memory according to the present invention; and FIGS. 2A to 2F are views showing the steps in manufacturing another logic semiconductor device having a non-volatile memory according to the present invention.

DETAILED DESCRIPTION OF THE PREFERRED EMBODIMENTS

A logic semiconductor device having a non-volatile memory and a method of manufacturing the same according to an embodiment of the present invention will be described below with reference to the accompanying drawings.

A logic semiconductor device having a non-volatile memory and a method of manufacturing the same according to the first embodiment of the present invention will be described below with reference to the sectional views sequentially showing the steps shown in FIGS. 1A to 1F.

As shown in FIG. 1A, a field oxide film 102 having a thickness of 5,000 to 15,000 Å which is to serve as an element isolating region is formed on the surface of a semiconductor substrate 101 by selective oxidation in a steam atmosphere at a temperature of 1,000° C. for 1 hr, after forming a well region on the surface of the substrate 101 by oxidation, impurity doping and diffusion.

Element region forming portions of a memory cell portion and a logic circuit portion of the substrate 101 are exposed, and a first thermal oxide film 103 having a thickness of 200 to 250 Å which is to serve as a first gate oxide film of the memory cell portion is formed on the entire surface of the resultant structure by thermal oxidation in an oxygen atmosphere at a temperature of 900° C. for 0.5 hr. A photoresist film 104 is formed on the entire surface, and a first thermal oxide film 103 on the element region forming portion of the memory cell portion is exposed to form an opening 105. A threshold value control impurity 106 such as boron, phosphorus, or arsenic is ion-implanted in the first thermal oxide film 103 from the opening 105 using the photoresist film 104 as a mask at an acceleration voltage of 35 to 140 keV. In FIG. 1A, reference numeral 106a denotes a region in which the impurity 106 for controlling the threshold value of the memory cell portion is implanted.

As shown in FIG. 1B, the photoresist film 104 is removed. After eliminating the first thermal oxide film 103, a thermal oxide film having a thickness of 200 to 250 μm, which serves as a first gate oxide film, is formed. A first polysilicon layer 107 which is to serve as the floating gate of the memory cell portion is formed on the entire surface of the resultant structure by, e.g., CVD. In order to convert the first polysilicon layer 107 into a conductive layer, phosphorus is doped into layer 107, and then thermal diffusion is performed so that the layer 107 has a predetermined resistivity. Alternatively, predetermined impurity ions of phosphorus, or arsenic may be implanted in the first polysilicon layer 107 at an acceleration voltage of 35 to 140 keV. A photoresist film (not shown) is formed on the resultant structure, and the first polysilicon layer 107 is patterned by photo-etching to determine a size of the floating gate of the memory cell portion in a direction of channel width and to expose the element region forming region of the logic circuit portion. A second gate oxide film (inter poly) of the memory cell portion and a 200- to 250-Å thick second thermal oxide film 108 which is to serve as a gate oxide film of the logic circuit portion are formed by, e.g., thermally oxidizing the surface of the polysilicon layer 107 and the exposed element region forming region of the logic circuit portion in an oxygen atmosphere at a temperature of 950° to 1,000° C. for 1 hr.

As shown in FIG. 1C, a photoresist film 109 is formed on the entire surface of the resultant structure, and an opening 110 is formed in a channel forming region of the logic circuit portion by photoetching. An impurity 111 such as boron, phosphorus, or arsenic for controlling the threshold value of the logic circuit portion is ion-implanted in the second thermal oxide film 108 from the opening 110 using the photoresist film 109 as a mask at an acceleration voltage of 35 to 140 keV. In FIG. 1C, reference numeral 111b denotes a region in which the impurity 111 for controlling threshold value of the logic circuit portion is implanted.

As shown in FIG. 1D, a second polysilicon layer 112 which is to serve as the control gate of the memory cell portion and the gate of the logic circuit portion is formed on the entire surface of the resultant structure. In order to convert the second polysilicon layer 112 into a conductive layer, phosphorus is doped into layer 112 at an atmosphere of phosphorus. Alternatively, a predetermined impurity 115 such as phosphorus or arsenic may be ion-implanted in the second polysilicon layer 113 at an acceleration voltage of 35 to 40 keV.

As shown in FIG. 1E, the second polysilicon layer 112, the second thermal oxide film 108, and the first polysilicon layer 107 are sequentially patterned by a CDE method, an RIE method, wet etching, or the like to determine sizes of the control gate and the floating gate of the memory cell portion in a direction of channel length, sizes of the gate of the logic circuit portion in the directions of channel width and length. At this time, a control gate 112a and a floating gate 107a of the memory cell portion, a gate 112b of the logic circuit portion, a first oxide film 103a and a second gate oxide film 108a of the memory cell portion, and a gate oxide film 108b of the logic circuit portion are formed. An impurity 113 of a conductivity type opposite to that of the semiconductor 101 and the well region is ion-implanted and diffused in the resultant structure in self-alignment using the control gate 112a of the memory cell portion, the gate 112b of the logic circuit portion, and the field oxide film 102 as masks to form source/- drain regions 113b. At the same time, source/drain may be formed at the time when the memory cell portion and the gate of the logic circuit portion are formed.

As shown in FIG. 1F, e.g., a CVD SiO$_2$ film 114 is formed as an insulating interlayer by, e.g., CVD. Note that a phosphosilicate glass film (P$_2$O$_5$ film), a borophosphosilicate glass film (BPSG fim), or a plasma SiO$_2$ film can be used instead of the CVD SiO$_2$ film 114. Thereafter, although not shown, a contact hole is formed in a predetermined position of the semiconductor device through the CVD SiO$_2$ film 114, and a predetermined wiring layer is formed on the resultant structure. Thus, a logic semiconductor device having a non-volatile memory according to the first embodiment is manufactured.

According to the above logic semiconductor device having a non-volatile memory and the method of manufacturing the same, the floating gate 107a of the memory cell portion and the gate 112b of the logic circuit portion respectively consist of polysilicon layers which are respectively formed in different steps. Therefore, the floating gate 107a of the memory cell portion and the gate 112b of the logic circuit portion can be formed so as to have the different thicknesses and characteristics with each other. In addition, after the second thermal oxide film 108 which is to serve as the gate oxide film (inter poly) of the memory cell portion is formed, then the impurity 111 for controlling the threshold value of the logic circuit portion is doped in the resultant structure. For this reason, the impurity 111 for controlling the threshold value of the logic circuit portion is not affected by heat generated in the annealing process for forming the second thermal oxide film 108. When the impurity is not affected by annealing for forming the second thermal oxide film 108, controllability of the threshold value of the logic circuit portion can be improved without disturbance of a channel profile of the logic circuit portion, thereby easily forming a predetermined channel profile. Therefore, a MOSFET suitable for micropatterning can be formed in the logic circuit portion.

The first gate oxide film 103a of the memory cell portion can be formed to have a thickness different from that of the gate oxide film 108b of the logic circuit portion.

A logic semiconductor device having a non-volatile memory and a method of manufacturing the same according to the second embodiment of the present invention will be described below with reference to sectional views shown in FIGS. 2A to 2F showing the steps in manufacturing the device.

As shown in FIG. 2A, after well region is formed on a surface of a substrate 201, a 5,000 to 15,000 Å thick field oxide film 202 which is to serve as an element isolating region is formed on the surface of a semiconductor substrate 201 by, e.g., selective oxidation in a steam atmosphere at a temperature of 1,000° C. for 5 hrs. Portions of the surface of the substrate 201 on which the element regions of a memory cell portion and a logic circuit portion are formed are exposed, and a 200- to 250-Å thick first thermal oxide film 203 which is to serve as the first gate oxide film of the memory cell portion is formed on the resultant structure by, e.g., thermal oxidation in an oxygen atmosphere at a temperature of 900° C. for 2 hrs. A photoresist film 204 is formed on the entire surface of the resultant structure, and an opening 205 is formed in the channel region of the memory cell portion by photoetching. An impurity 206 such as phosphorus, boron, or arsenic for controlling the threshold value of the memory cell portion is ion-implanted in the first thermal oxide film 203 from the opening 205 at an acceleration voltage of 35 to 140 keV. In FIG. 2A, reference numeral 206a denotes a region in which the impurity 206 for controlling the threshold value of the memory cell portion is ion-implanted. Note that the thermal oxide film 203 is removed after the ion-implantation, and then a new thermal oxide film may be formed.

As shown in FIG. 2B, the photoresist film 204 is removed. A first polysilicon layer 207 which is to serve as the floating gate of the memory cell is formed on the entire surface of the resultant structure by, e.g., CVD. In order to convert the first polysilicon layer 207 into a conductive layer, phosphorus is doped into the layer 207, and then thermal diffusion is performed. Alternatively, a predetermined impurity such as phosphorus, or arsenic may be ion-implanted in the first polysilicon layer 207 at an acceleration voltage of 35 to 140 keV. A photoresist film (not shown) is formed on the resultant structure, and the first polysilicon layer 207 is patterning by photo-etching to determine a size of the floating gate of the memory cell in a direction of channel width and to expose a logic circuit portion forming region. A thermal oxide film 208 having a thickness of 200 Å is formed on the entire surface of the resultant structure by, e.g., thermal oxidation in an oxygen atmosphere at a temperature of 900° to 1,000° C. for 1 hr. A first nitride film (Si$_3$N$_4$ film) 209 is formed on the second thermal oxide film 208 by a plasma method. The surface of the first nitride film 209 is oxidized in an oxygen atmosphere at a temperature of 850° to 950° C. for 1 hr to form a third oxide film (SiON film) 210 having a thickness of 300 Å. A second nitride film (Si$_3$N$_4$ film) 211 having a thickness of 50 Å may be formed again. A photoresist film (not shown) is formed on the resultant structure, and the second nitride film 211, third oxide film 210, the first nitride film 209, and the second thermal oxide film 208 are removed from a logic circuit portion forming region by photoetching to expose the logic circuit portion forming region of the substrate 201. A fourth thermal oxide film 212 which is to serve as a sacrificial oxide film of the logic circuit portion is formed on the entire surface of the resultant structure in an oxygen atmosphere at a temperature of 900° C. for 1 hr.

As shown in FIG. 2C, a photoresist film 213 is formed on the entire surface of the resultant structure, and an opening 214 is formed in the channel region of the logic circuit portion by photoetching. An impurity 215 such as boron, phosphorus, or arsenic for controlling the threshold value in the source thermal oxide film 212 serving as a sacrificial oxide film from the opening 214 using the photoresist film 213 as a mask at an acceleration voltage of 35 to 140 keV. In FIG. 2C, reference numeral 215b denotes a region in which the impurity 215 for controlling the threshold value of the logic circuit portion is implanted.

As shown in FIG. 2D, the fourth thermal oxide film 212 serving as the sacrificial oxide film is entirely removed from the resultant structure to expose the surface of the logic circuit portion forming region. A fifth insulating film 216 which is to serve as the gate oxide film of the logic circuit portion is formed on the entire surface of the resultant structure by, e.g., thermal oxidation in an oxygen atmoshpere at a temperature of 900° C. A second polysilicon layer 217 which is to serve as the control gate of the memory cell portion and the gate of the logic circuit portion is formed on the entire surface by, e.g., CVD. In order to convert the second polysilicon layer 217 into a conductive layer, phosphorus is doped into the layer 217, and then thermal diffusion is performed. Alternatively, a predetermined impurity such as phosphorus or arsenic may be ion-implanted in the second polysilicon layer 217 at an acceleration voltage of 35 to 140 keV.

As shown in FIG. 2E, the second polysilicon layer 217, the fifth thermal oxide film 216, the second nitride film 211, the third oxide film 210, the first nitride film 209, the second thermal oxide film 208, first polysilicon layer 207, and first thermal oxide film 203 are sequentially patterned by a CDE method, a RIE method, or wet etching to determine the sizes of the control gate and the floating gate of the memory cell portion in a direction of channel length and the sizes of the gate of the logic circuit portion in the directions of channel length and width. At this time, a control gate 217a and a floating gate 207a of the memory cell portion, a gate 217b of the logic circuit portion, and a second gate insulating film (inter poly) consisting of a first gate oxide film 203a, the oxide film 208, the nitride film 209, the oxide film 210, the nitride film 211 and an oxide film 216a, and a gate oxide film 216b of the logic circuit portion are formed. An impurity 218 such as boron, phosphorus, or arsenic having a conductivity type opposite to the semiconductor substrate 201 is ion-implanted in the resultant structure in a self-alignment using the control gate 217a of the memory cell portion, the gate 217b of the logic circuit portion, and the field oxide film 202 as masks at an acceleration voltage of 35 to 140 keV, and then the impurity 201 is diffused to form source/drain regions 218b. At the same time, source/drain regions (not shown) are formed in the memory cell portion. Source/drain regions of the memory cell portions and the logic circuit may be formed in the different step.

As shown in FIG. 2F, a CVD oxide film 219 is formed as an insulating interlayer on the entire surface of the resultant structure by CVD method. Thereafter, although not shown, a contact hole is formed in a predetermined position of the semiconductor device through the CVD oxide film 219, and a predetermined wiring layer is formed on the resultant structure. Thus, a logic semiconductor device having a non-volatile memory according to the present invention is manufactured.

According to the above logic semiconductor device having a non-volatile memory and the method of manufacturing the same, the floating, gate 207a of the memory cell portion and the floating gate 217b of the logic circuit portion consist of polysilicon layers formed in difference steps. Therefore, the thicknesses, characteristics, and the like of the floating gate 207a of the memory cell portion and the gate 217b of the logic circuit portion can be changed as in the first embodiment. In addition, the second gate insulating film (inter poly) having a multilayered structure consisting of the nitride film and the oxide film of the memory cell portion, and then the impurity 215 for controlling the threshold value of the logic circuit portion is doped in the resultant structure. For this reason, the impurity 215 for controlling the threshold value of the logic circuit portion is not affected by heat generated in the annealing process for forming the second gate insulating film as in the first embodiment. Therefore, a MOSFET suitable for micropatterning can be formed in the logic circuit portion.

According to the second embodiment, since the second gate insulating film having a multilayered structure consisting of the nitride and oxide films is formed on the first polysilicon layer 207, the sacrificial oxide film 212 can be formed in the logic circuit portion. By forming the sacrificial oxide film 212, the quality of the gate oxide film 216b in the logic circuit portion is excellent. The gate breakdown voltage of a MOSFET in the logic circuit portion can be increased, thereby improving the reliability of the MOSFET.

The first gate oxide film 203a and the second gate insulating film (inter poly) of the memory cell portion and the gate oxide film 216b of the logic circuit portion can be formed to have different thicknesses.

Note that, in the above second embodiment, the three-layered insulating film cons-sting of the nitride film 209, the oxide film 210, and nitride film 211 is used as the second gate insulating film (inter poly) in order to obtain excellent characteristics of the memory cell portion such as a high breakdown voltage. Depending on applications, e.g., a single nitride film having a low oxidation rate may be used as the second gate insulating film.

Thus, according to the present invention, after the second gate insulating film (inter poly) of the memory cell portion is formed (it is normally formed at a temperature of 950° to 1,100° C.), an impurity for controlling the threshold value of the logic circuit portion is doped in the second gate insulating film. For this reason, the logic circuit portion is rarely affected by a thermal influence, and a MOSFET suitable for micropatterning can be formed. Therefore, the logic circuit portion can be micropatterned as in a single logic LSI. In particular, the present invention is very effective for a logic semiconductor device having a non-volatile memory in which the area of a memory cell is smaller than that of a logic circuit portion.

Needless to say, a well region is formed prior to the formation of each of the field oxide films 102 and 202 shown in FIGS. 1A and 2A.

What is claimed is:

1. A method of manufacturing a semiconductor device in which a non-volatile memory and a logic circuit portion are formed on a single semiconductor substrate, comprising the steps of:

forming a first insulating film which is to serve as an element isolating region on a surface of a semiconductor substrate;

partially removing said first insulating film to form a forming region for a memory cell portion and a forming region for a logic circuit portion on said substrate;

forming a second insulating film which is to serve as a first gate insulating film of a cell transistor of said memory cell portion on an entire surface of a resultant structure;

doping an impurity for controlling a threshold value of said cell transistor in a channel region of said cell transistor of said memory cell portion;

forming a first conductive layer on an entire surface;

patterning said first conductive layer to form a floating gate of said memory cell portion and to expose said logic circuit portion forming region;

forming a laminated insulating layer consisting of a plurality of insulating films on an entire surface of a resultant structure by sequentially forming a first oxide film and a first nitride film, oxidizing a surface of said nitride film to form a second oxide film, and forming a second nitride film;

patterning said laminated insulating layer to expose said logic circuit portion forming region on the substrate;

forming a second insulating film which is to serve as a sacrificial oxide film of said logic circuit portion on an entire surface of a resultant structure;

doping an impurity for controlling a threshold value of a transistor of said logic circuit portion in said logic circuit portion through said second insulating film;

removing said second insulating film;

forming a third insulating film on an entire surface of a resultant structure;

forming a second conductive layer on an entire surface of a resultant structure; and sequentially patterning said second conductive layer and said third insulating film to form a control gate of said memory cell portion and to form a gate of said transistor of said logic circuit portion.

2. A method of manufacturing a semiconductor device in which a non-volatile memory and a logic circuit portion are formed on a single semiconductor substrate, comprising the steps of:

forming a first insulating film which is to serve as an element isolating region on a surface of a semiconductor substrate;

partially removing said first insulating film to form a forming region of a memory cell portion and a forming region of a logic circuit portion of said substrate;

forming a second insulating film which is to serve as a first gate insulating film of a cell transistor of said memory cell portion on an entire surface of a resultant structure;

doping an impurity for controlling a threshold value of said cell transistor in a channel region of said cell transistor of said memory cell portion;

forming a first conductive layer on an entire surface;

patterning said first conductive layer to form a floating gate of said memory cell portion and to expose said logic circuit portion forming region;

sequentially forming a first oxide film, a first nitride film, a second oxide film and a second nitride film;

sequentially patterning said second nitride film, said second oxide film, said first nitride film and said first oxide film to expose said logic circuit portion forming region on the substrate;

forming a second insulating film which is to serve as a sacrificial oxide film of said logic circuit portion on an entire surface of a resultant structure;

doping an impurity for controlling a threshold value of a transistor of said logic circuit portion in said logic circuit portion through said second insulating film;

removing said second insulating film;

forming a third insulating film on an entire surface of a resultant structure;

forming a second conductive layer on an entire surface of a resultant structure; and sequentially patterning said conductive layer and said third insulating film to form a control gate of said memory cell portion and to form a gate of said transistor of said logic circuit portion.

* * * * *